US009479189B2

(12) United States Patent
Nishi

(10) Patent No.: US 9,479,189 B2
(45) Date of Patent: *Oct. 25, 2016

(54) A/D CONVERTER, SOLID-STATE IMAGING DEVICE AND CAMERA SYSTEM

(71) Applicant: Sony Corporation, Tokyo (JP)

(72) Inventor: Takafumi Nishi, Fukuoka (JP)

(73) Assignee: SONY CORPORATION, Tokyo (JP)

( * ) Notice: Subject to any disclaimer, the term of this patent is extended or adjusted under 35 U.S.C. 154(b) by 48 days.

This patent is subject to a terminal disclaimer.

(21) Appl. No.: 14/184,185

(22) Filed: Feb. 19, 2014

(65) Prior Publication Data

US 2014/0167998 A1 Jun. 19, 2014

Related U.S. Application Data

(63) Continuation of application No. 13/707,151, filed on Dec. 6, 2012, now Pat. No. 8,704,898, which is a continuation of application No. 12/659,799, filed on Mar. 22, 2010, now Pat. No. 8,358,349.

(30) Foreign Application Priority Data

Apr. 17, 2009 (JP) ................................ 2009-100604

(51) Int. Cl.
*H04N 5/225* (2006.01)
*H04N 5/335* (2011.01)
*H03M 1/12* (2006.01)
*H03M 1/34* (2006.01)
*H03M 1/06* (2006.01)
*H04N 5/378* (2011.01)
*H01L 27/146* (2006.01)
*H03M 1/10* (2006.01)
*H03M 1/56* (2006.01)

(52) U.S. Cl.
CPC ............. *H03M 1/34* (2013.01); *H01L 27/146* (2013.01); *H03M 1/0678* (2013.01); *H03M 1/12* (2013.01); *H04N 5/378* (2013.01); *H03M 1/1023* (2013.01); *H03M 1/123* (2013.01); *H03M 1/56* (2013.01)

(58) Field of Classification Search
CPC .. H03M 1/12; H03M 1/0678; H03M 1/1023; H03M 1/123; H03M 1/34; H03M 1/56; H01L 27/146; H04N 5/378
USPC .......................... 348/207.1, 222.1, 241, 300
See application file for complete search history.

(56) References Cited

U.S. PATENT DOCUMENTS 5,877,715 A * 3/1999 Gowda et al. ................. 341/122
5,990,948 A 11/1999 Sugiki
(Continued)

FOREIGN PATENT DOCUMENTS

JP 2005-278135 10/2005

OTHER PUBLICATIONS

W. Yang et al., "An Integrated 800×600 CMOS Image System," ISSCC Digest of Technical Papers, pp. 304-305, Feb. 1999.

*Primary Examiner* — Trung Diep
(74) *Attorney, Agent, or Firm* — Chip Law Group

(57) ABSTRACT

An A/D converter includes: plural comparators to which reference voltages as ramp waves different from each other are supplied, which are configured to compare the supplied reference voltages with an analog input signal; and plural latches arranged so as to correspond to the plural comparators, which are configured to count comparison time of the corresponding comparators, to stop counting when an outputs of the comparator is inverted and to store the count value, wherein the plural reference voltages are off set by an arbitrary voltage at the same time point.

17 Claims, 13 Drawing Sheets

(56) References Cited

U.S. PATENT DOCUMENTS

| | | |
|---|---|---|
| 7,310,452 B2 | 12/2007 | Nam |
| 7,924,335 B2 | 4/2011 | Itakura et al. |
| 2005/0195304 A1 | 9/2005 | Nitta et al. |
| 2007/0046795 A1 | 3/2007 | Yamashita |
| 2008/0252762 A1* | 10/2008 | Iwamoto ............ H04N 5/35518 348/301 |

* cited by examiner

FIG.7

| TIME t | | | 1 | 2 | 3 | 4 | 5 | MEMORY DEFINITE VALUE | LOGIC CIRCUIT CALCULATION RESULT |
|---|---|---|---|---|---|---|---|---|---|
| CASE (1) | COMPARATIVE TECHNIQUE | COMPARATOR | 0 | 0 | 1 | 1 | 1 | | (COMPARISON TARGET)3 |
| | | MEMORY | 1 | 2 | 3 | 3 | 3 | 3 | |
| | PRESENT INVENTION | FIRST COMPARATOR | 0 | 1 | 1 | 1 | 1 | | (2+2)-1=3 |
| | | FIRST MEMORY | 1 | 2 | 2 | 2 | 2 | 2 | |
| | | SECOND COMPARATOR | 0 | 1 | 1 | 1 | 1 | | |
| | | SECOND MEMORY | 1 | 2 | 2 | 2 | 2 | 2 | |
| CASE (2) | COMPARATIVE TECHNIQUE | COMPARATOR | 0 | 0 | 0 | 1 | 1 | | (COMPARISON TARGET)4 |
| | | MEMORY | 1 | 2 | 3 | 4 | 4 | 4 | |
| | PRESENT INVENTION | FIRST COMPARATOR | 0 | 1 | 1 | 1 | 1 | | (3+2)-1=4 |
| | | FIRST MEMORY | 1 | 2 | 3 | 3 | 3 | 3 | |
| | | SECOND COMPARATOR | 0 | 1 | 1 | 1 | 1 | | |
| | | SECOND MEMORY | 1 | 2 | 2 | 2 | 2 | 2 | |
| CASE (3) | COMPARATIVE TECHNIQUE | COMPARATOR | 0 | 0 | 0 | 0 | 1 | | (COMPARISON TARGET)5 |
| | | MEMORY | 1 | 2 | 3 | 4 | 5 | 5 | |
| | PRESENT INVENTION | FIRST COMPARATOR | 0 | 1 | 1 | 1 | 1 | | (3+3)-1=5 |
| | | FIRST MEMORY | 1 | 2 | 3 | 3 | 3 | 3 | |
| | | SECOND COMPARATOR | 0 | 0 | 1 | 1 | 1 | | |
| | | SECOND MEMORY | 1 | 2 | 3 | 3 | 3 | 3 | |

A/D CONVERTER, SOLID-STATE IMAGING DEVICE AND CAMERA SYSTEM

CROSS REFERENCES TO RELATED APPLICATIONS

This is a Continuation Application of U.S. patent application Ser. No. 13/707,151, filed on Dec. 6, 2012 now U.S. Pat. No. 8,704,898, issued on Apr. 22, 2014, which is a Continuation Application of U.S. patent application Ser. No. 12/659,799, filed on Mar. 22, 2010, now U.S. Pat. No. 8,358,349, issued on Jan. 22, 2013, which claims priority from Japanese Patent Application JP 2009-100604 filed with the Japanese Patent Office on Apr. 17, 2009 the entire contents of which being incorporated herein by reference.

BACKGROUND OF THE INVENTION

1. Field of the Invention

The present invention relates to an A/D converter which can be applied to a solid-state imaging device typified by a CMOS image sensor, a solid-state imaging device and a camera system.

2. Description of the Related Art

As for the CMOS image sensor, the same manufacturing process as common CMOS-type integrated circuits can be used for the manufacture thereof as well as driving can be performed by a single power source, and further, an analog circuit and a logic circuit using the CMOS process can be mixed on the same chip.

Accordingly, the CMOS image sensor has plural big advantages such that the number of peripheral ICs can be reduced.

The mainstream of a CCD output circuit is 1-ch output using a FD amplifier having a floating diffusion layer (FD).

On the other hand, the CMOS image sensor has FD amplifiers at respective pixels, the mainstream of the output is a column-parallel output type in which a given one row in a pixel array is selected and these pixels are simultaneously read in the column direction.

This is because it is difficult to obtain sufficient drive performance by the FD amplifiers arranged in the pixels and thus it is necessary to reduce the data rate, therefore, parallel processing is advantageous.

An awful lot of readout (output) circuits of pixel signals in the column-parallel output CMOS image sensor have been proposed.

One of the most advanced forms of these circuits is a type having an analog-digital converter (hereinafter, abbreviated as ADC) in each column, in which pixel signals are taken out as digital signals.

The CMOS image sensor on which the column-parallel type ADCs are mounted is disclosed in, for example, JP-A-2005-278135 (Patent Document 1) and W. Yang et. al., "An Integrated 800×600 CMOS Image System" ISSCC Digest of Technical Papers, pp. 304-305, February 1999) (Non-patent document 1).

FIG. 1 is a block diagram showing a configuration example of a column-parallel ADC mounted solid-state imaging device (CMOS image sensor).

A solid-state imaging device 1 includes a pixel section 2, a vertical scanning circuit 3, a horizontal transfer scanning circuit 4 and a column processing circuit group 5 having an ADC group as shown in FIG. 1.

The solid-state imaging device 1 further includes a digital-analog converter (hereinafter, abbreviated as DAC) 6 and amplifier circuits (S/A) 7.

The pixel section 2 is configured by unit pixels 21 each having a photodiode (photoelectric conversion element) and an in-pixel amplifier being arranged in a matrix state.

In the column processing circuit group 5, plural columns of column processing circuits 51 each forming the ADC in each column are arranged.

Each column processing circuit (ADC) 51 includes a comparator 51-1 comparing a reference voltage Vslop which is a ramp waveform (RAMP) obtained by changing a reference voltage generated by the DAC 6 into a step-shape with an analog signal obtained from pixels of each row line through a vertical signal line.

Each column processing circuit 51 further includes a latch (memory) which counts comparison time of the comparator 51-1 and holds the count result.

The column processing circuits 51 have an n-bit digital signal converting function and are arranged with respect to respective vertical signal lines (column line) 8-1 to 8-n, which constitutes a column-parallel ADC block.

Outputs of respective memories 51-2 are connected to horizontal signal lines 9 having, for example, a k-bit width. K-pieces of amplifier circuits 7 corresponding to the horizontal transfer lines 9 are arranged.

FIG. 2 shows a timing chart of the circuit of FIG. 1.

In each column processing circuit (ADC) 51, an analog signal (potential Vs1) read to the vertical signal line 8 is compared with the reference voltage Vslop which changes into a step-shape in the comparator 51-1.

At this time, counting is performed in the latch 51-2 until levels of the analog potential Vs1 and the reference voltage Vslop intersect and an output from the comparator 51-1 is inverted, then, the potential of the vertical signal line (analog signal) Vs1 is converted into a digital signal (A/D converted).

The A/D conversion is made twice in one reading.

In the first conversion, reset levels (P phase) of the unit pixels 21 are read to the vertical signal lines 8 (8-1 to 8-n) and A/D conversion is made.

The reset levels P-phase include variations according to pixels.

In the second conversion, signals (D phase) which have been photoelectrically converted in respective unit pixels 21 are read to the vertical signal lines 8 (8-1 to 8-n) and A/D conversion is made.

The D phase also includes variations according to pixels, therefore, (D phase level-P phase level) is executed to thereby realize correlated double sampling (CDS).

Signals converted into digital signals are recorded in the latches (memories) 51-2, sequentially read to the amplifier circuits 7 through the horizontal transfer lines 9 by the horizontal transfer scanning circuit 4 and finally outputted.

Accordingly, column-parallel output processing is performed.

SUMMARY OF THE INVENTION

However, in the solid-state imaging device having the above configuration, a ramp wave to be the reference for knowing potentials of P phase and D phase is one. P-phase reading time and D-phase reading time are determined by a gradient of the reference voltage Vslop which is the ramp wave as an output of the DAC6.

Therefore, the reading time can be reduced when the gradient of the ramp wave is made steep.

For that purpose, it is necessary to improve operation speed of the DAC 6.

However, it is not easy to improve the operation speed of the DAC 6 which is an analog circuit while maintaining the precision, therefore, it is difficult to speedup the reading.

When the variation amount in each step of the ramp waves outputted by the DAC 6, namely, the step width is increased, the gradient of the ramp wave becomes steep, therefore, the reading time can be reduced without improving the operation speed of the DAC 6.

However, 1 LSB after the digital conversion is also increased merely by increasing the step width, which reduces the A/D conversion accuracy.

Thus, it is desirable to provide an A/D converter, a solid-state imaging device and a camera system capable of reducing reading time as well as realizing A/D conversion with high bit precision.

According to an embodiment of the invention, there is provided an A/D converter including plural comparators to which reference voltages as ramp waves different from each other are supplied, which are configured to compare the supplied reference voltages with an analog input signal, and plural latches arranged so as to correspond to the plural comparators, which are configured to count comparison time of the corresponding comparators, to stop counting when an output of the comparator is inverted and to store the count values, in which the plural reference voltages are offset by an arbitrary voltage at the same time point.

According to another embodiment of the invention, there is provided a solid-state imaging device including a pixel section in which plural pixels performing photoelectric conversion are arranged in a matrix state, and a pixel signal reading circuit performing reading of pixel signals from plural pixels in the pixel section, in which the pixel signal reading circuit has plural comparators to which plural reference voltages as different ramp waves are supplied, which are configured to compare the supplied reference voltages with an analog signal potential read out from the pixel in a corresponding column, and plural latches arranged so as to correspond to the plural comparators, which are configured to count comparison time of the corresponding comparators, to stop counting when an outputs of the comparator is inverted and store the count value so as to correspond to column arrangement of pixels, and the plural reference voltages are offset by an arbitrary voltage at the same time point.

According to still another embodiment of the invention, there is provided a camera system including a solid-state imaging device, and an optical system imaging a subject image on the solid-state imaging device, in which the solid-state imaging device has a pixel section in which plural pixels performing photoelectric conversion are arranged in a matrix state, and a pixel signal reading circuit performing reading of pixel signals from plural pixels in the pixel section, the pixel signal reading circuit has plural comparators to which plural reference voltages as different ramp waves are supplied, which are configured to compare the supplied reference voltages with an analog signal potential read out from the pixel in a corresponding column, and plural latches arranged so as to correspond to the plural comparators, which are configured to count comparison time of the corresponding comparators, to stop counting when an outputs of the comparator is inverted and to store the count value so as to correspond to column arrangement of pixels, and the plural reference voltages are offset by an arbitrary voltage at the same time point.

According to the embodiments of the invention, reference voltages as ramp waves different from each other which are offset by the arbitrary voltage at the same time are compared with an analog input signal in plural comparators.

The plural latches count comparison time of respective comparators, which stops counting when the output of comparator is inverted and stores the count value.

According to the embodiments of the invention, it is possible to realize A/D conversion with high bit precision without increasing a clock frequency or increasing the reading time.

BRIEF DESCRIPTION OF THE DRAWINGS

FIG. 7 is a chart for explaining functions of a logic circuit according to the embodiment;

DESCRIPTION OF THE PREFERRED EMBODIMENTS

Hereinafter, embodiments of the invention will be explained with reference to the drawings.

The explanation will be made in the following order.
1. Entire configuration example of a solid-state imaging device
2. Configuration example of a column ADC
3. Example of forming plural reference voltages by a DAC
4. Configuration example of a camera system FIG. 3 is a block diagram showing a configuration example of a column-parallel ADC mounted solid-state imaging device (CMOS image sensor) according to an embodiment of the invention.

Figure 3:
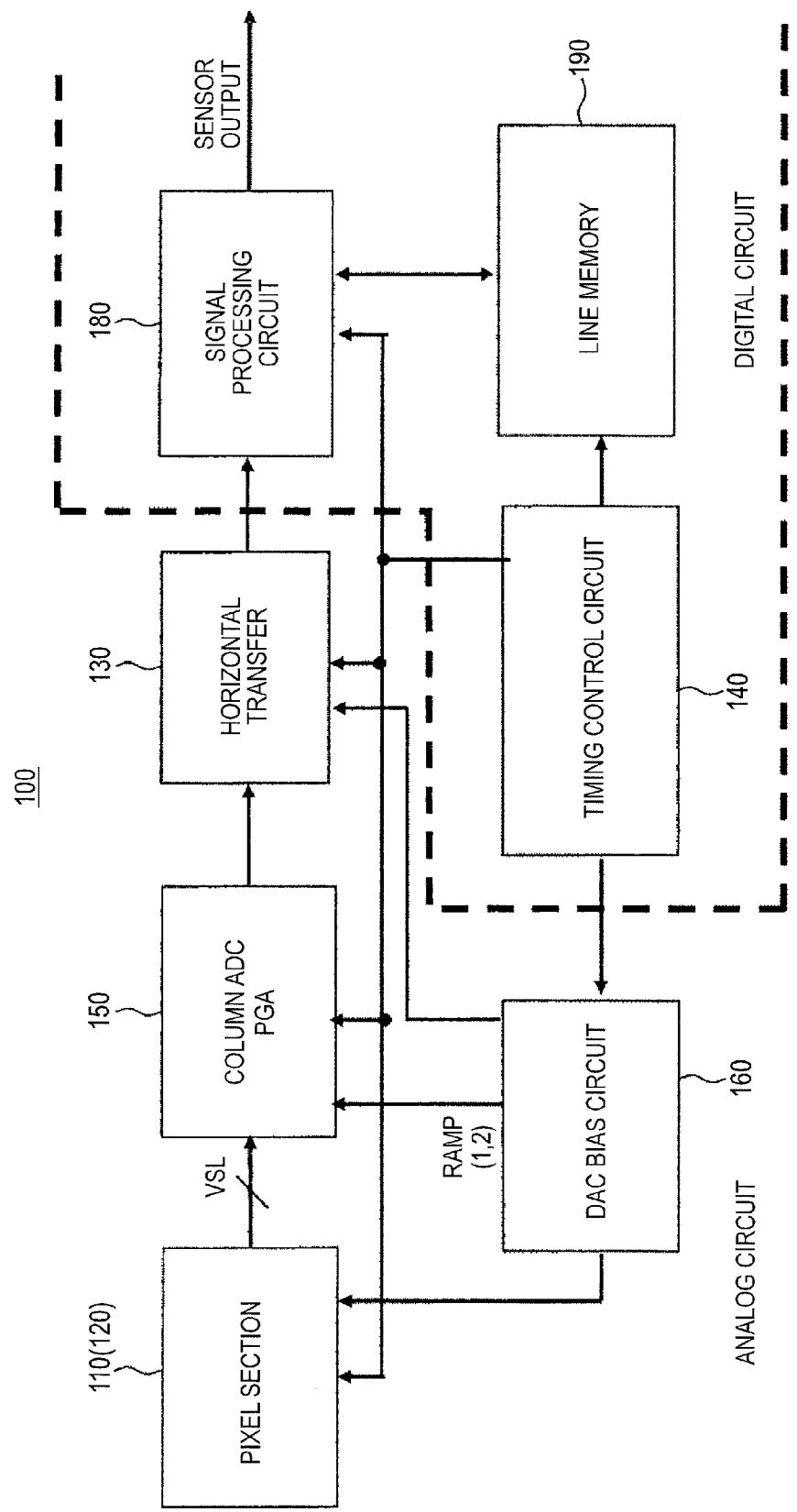
FIG. 3 is a block diagram showing a configuration example of a column-parallel ADC mounted solid-state imaging device (CMOS image sensor) according to an embodiment of the invention.
Figure 4:
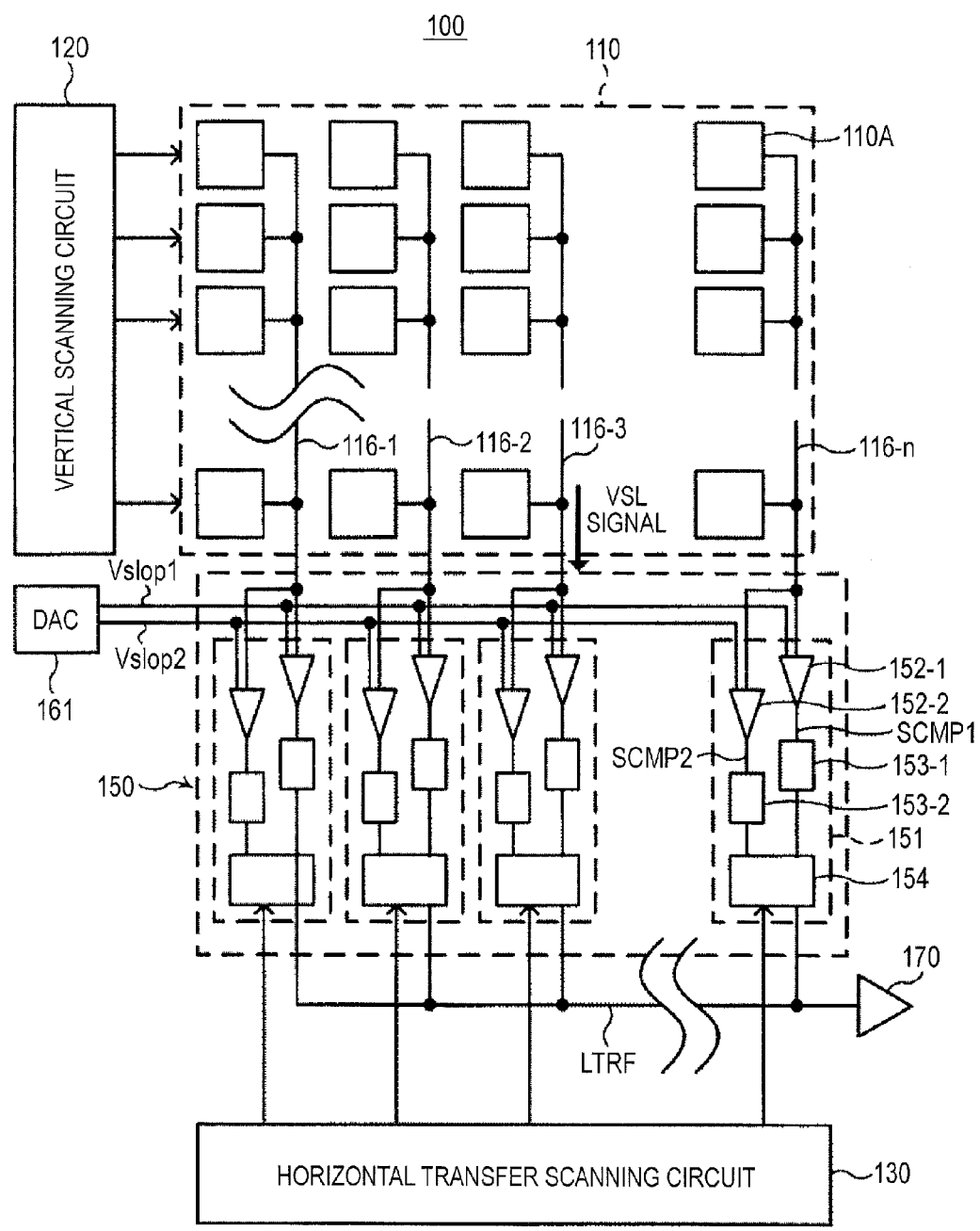
FIG. 4 is a block diagram specifically showing an ADC group in the column-parallel ADC mounted solid-state imaging device (CMOS image sensor) in FIG. 3.

FIG. 4 is a block diagram more specifically showing an ADC group in the column-parallel ADC mounted solid-state imaging device (CMOS image sensor) of FIG. 3.

1. Entire Configuration Example of a Solid-State Imaging Device

A solid-state imaging device 100 includes a pixel section 110 as an imaging section, a vertical scanning circuit 120, a horizontal transfer scanning circuit 130 and a timing control circuit 140 as shown in FIG. 3 and FIG. 4.

The solid-state imaging device 100 further includes a column processing circuit group 150 which is an ADC group as a pixel signal reading circuit and a DAC bias circuit 160 including a DAC (analog-digital converter) 161.

The solid-state imaging device 100 includes amplifier circuits (S/A) 170, a signal processing circuit 180 and line memories 190.

In the above components, the pixel section 110, the vertical scanning circuit 120, the horizontal transfer scanning circuit 130, the ADC group 150, the DAC bias circuit 160 and the amplifier circuits (S/A) 170 are configured by analog circuits.

The timing control circuit 140, the signal processing circuit 180 and the line memories 190 are configured by digital circuits.

In the pixel section 110, plural unit pixels 110A each having a photodiode (photoelectric conversion element) and a in-pixel amplifier are arranged two-dimensionally in a m×n matrix.

[Configuration Example of a Unit Pixel]

Figure 5:
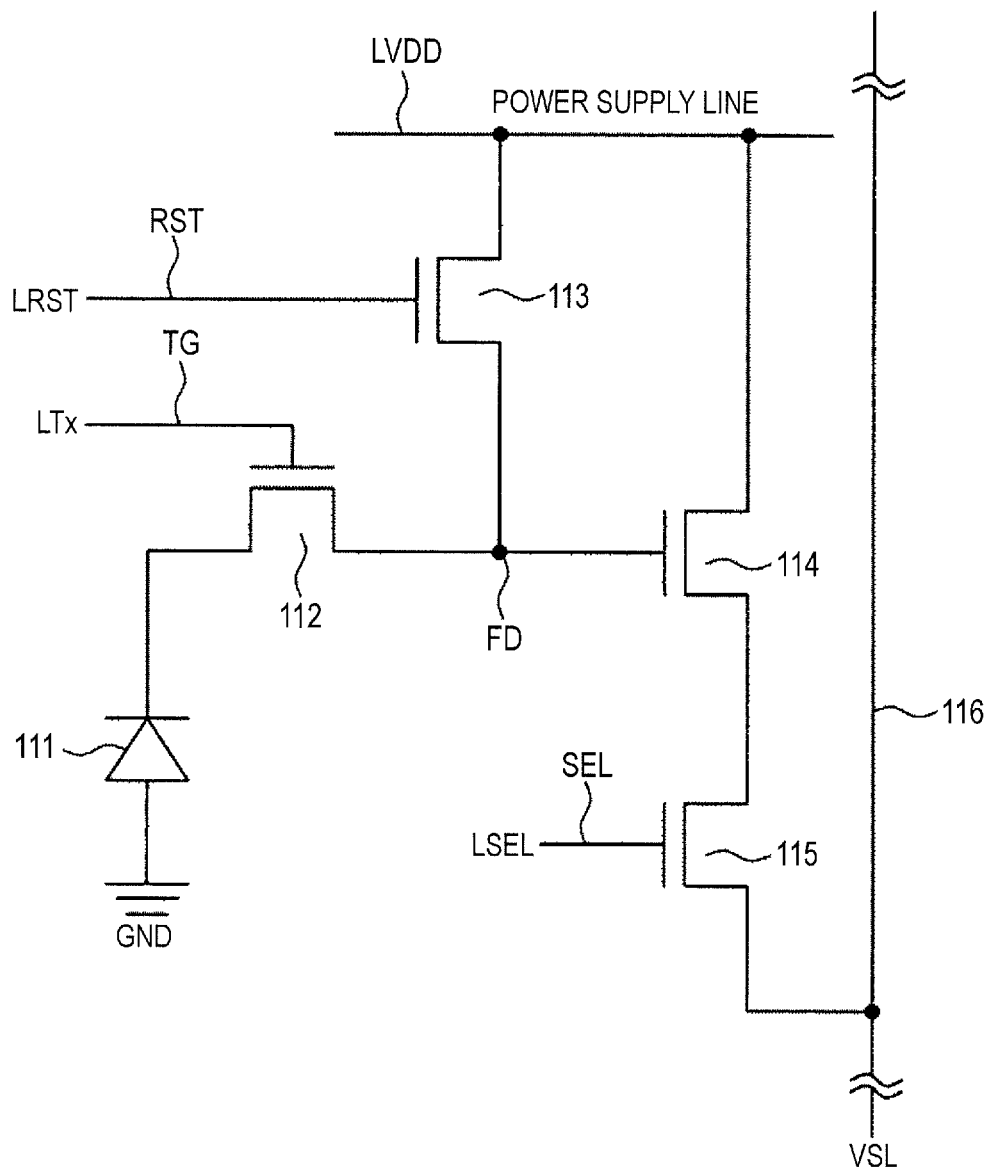
FIG. 5 is a diagram showing an example of a pixel in the CMOS image sensor including four transistors according to the embodiment.

FIG. 5 is a diagram showing an example of a pixel in a CMOS image sensor including four transistors according to an embodiment of the invention.

The unit pixel 110A includes, for example, a photodiode 111 as a photoelectric conversion element.

The unit pixel 110A includes four transistors, namely, a transfer transistor 112 as a transfer element, a reset transistor 113 as a reset element, an amplification transistor 114 and a selection transistor 115 as active elements with respect to one photodiode 111.

The photodiode 111 photoelectrically converts incident light into electric charges (electrons in this case) corresponding to the amount of light.

The transfer transistor 112 is connected between the photodiode 111 and a floating diffusion FD as an output node.

The transfer transistor 112 transfers electrons photoelectrically converted in the photodiode 111 to the floating diffusion FD by a drive signal TG being given to a gate thereof (transfer gate) through a transfer control line LTx.

The reset transistor 113 is connected between a power supply line LVDD and the floating diffusion FD.

The reset transistor 113 resets a potential of the floating diffusion FD into a potential of the power supply line LVDD by a reset RST being given to a gate thereof through a reset control line LRST.

A gate of the amplification transistor 114 is connected to the floating diffusion FD. The amplification transistor 114 is connected to the vertical signal line 116 through the selection transistor 115, forming a source follower with a constant-current source which is outside the pixel.

A control signal (an address signal or a selection signal) SEL is given to a gate of the selection transistor 115 through the selection control line LSEL, thereby turning on the selection transistor 115.

When the selection transistor 115 is turned on, the amplification transistor 114 amplifies the potential of the floating diffusion FD and outputs a voltage corresponding to the potential to the vertical signal line 116. The voltage outputted from respective pixels through the vertical signal line 116 is outputted to the column processing circuit group 150 as the pixel signal reading circuit.

The above operations are simultaneously performed in respective pixels of one row in parallel because, for example, respective gates of the transfer transistor 112, the reset transistor 113 and the selection transistor 115 are connected in each row.

The resent control line LRST, the transfer control line LTx and the selection control line LSEL are arranged in the pixel section 110 as one set with respect to each row in the pixel arrangement.

These resent control line LRST, the transfer control line LTx and the selection control line LSEL are driven by the vertical scanning circuit 120 as a pixel drive unit.

In the solid-state imaging device 100, the timing control circuit 140 generating internal clocks as a control circuit for sequentially reading signals from the pixel section 110, the vertical scanning circuit 120 controlling row addresses as well as row scanning and the horizontal transfer scanning circuit 130 controlling column addresses as well as column scanning are arranged.

The timing control circuit 140 generates timing signals necessary for signal processing in the pixel section 110, the vertical scanning circuit 120, the horizontal transfer scanning circuit 130, the column processing circuit group 150, the DAC bias circuit 160, the signal processing circuit 180 and the line memories 190.

In the pixel section 110, video and screen images are photoelectrically converted in respective pixel rows by accumulating and discharging photons using a line shutter, outputting the analog signals VSL to respective column processing circuits 151 in the column processing circuit group 150.

2. Configuration Example of a Column ADC

The column processing circuit group 150 according to the embodiment has a function of using plural reference voltages so as to be offset by an arbitrary voltage at the same time point in a process of converting the analog signal VSL into a digital signal and calculating plural comparison results between the analog value and plural ramp waves.

In the column processing circuit group (column ADC), plural reference voltages as ramp waves the step width of which is increased are prepared, not one reference voltage, and these plural voltages are used by shifting them respectively, which enables high speed reading without reducing the A/D conversion accuracy.

On the other hand, in the column processing group (column ADC), plural reference voltages as ramp waves the step width of which is not increased are prepared, and these plural voltages are used by shifting them respectively, which enables high precision reading in the same reading time.

In the column processing circuit group (column ADC), it is possible to read out the high illumination side which is difficult to be viewed by human beings with low precision and with low power consumption by using the fact that 1 LSB is increased just by stopping supply of the reference voltage which is part of ramp waves.

In the embodiment, as one of examples which realize high speed reading by using the reference voltages which are plural ramp waveforms by shifting them, a method of using reference voltages Vslop1, Vslop2 which are two ramp waves as shown in FIG. 4 will be explained.

In the column processing circuit group (ADC group) 150, plural columns of column processing circuits (ADC) 151 which are ADC blocks are arranged.

That is, the column processing circuit group 150 has a k-bit digital signal conversion function, in which column parallel ADC blocks are configured by being arranged in respective vertical signal lines (column lines) 116-1 to 116-n.

Each column processing circuit 151 includes first and second comparators 152-1, 152-2 which compare one analog signal (potential VSL) obtained from pixels through the vertical signal line 116 with two first and second reference voltages Vslop1, Vslop2.

Figure 6:
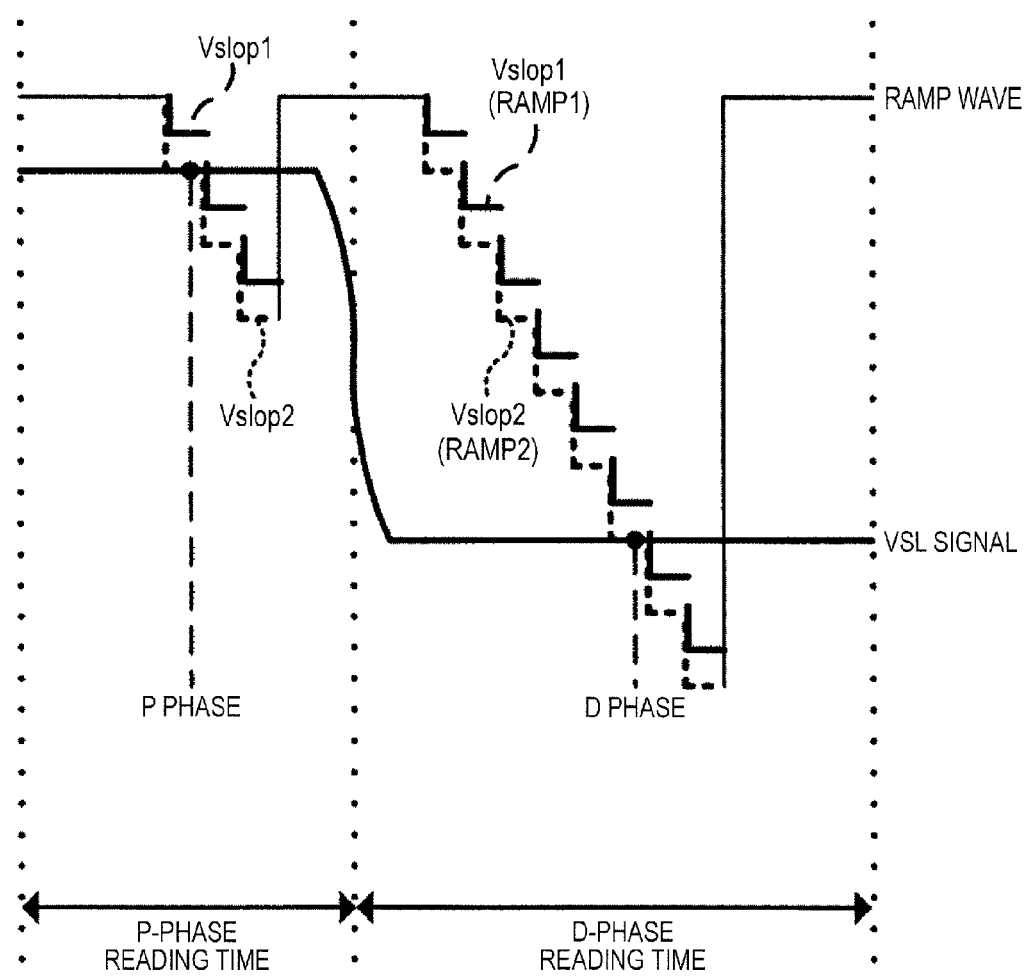
FIG. 6 is a view showing a first forming example of the first and second reference voltages according to the embodiment.

The first and second reference voltages Vslop1, Vslop2 are formed by shifting the two ramp waves (a ramp wave RAMP1 and a ramp wave RAMP2) by the original step width thereof, in which one ramp wave has twice the width of the other ramp wave as shown in FIG. 6.

Each column processing circuit 151 has a first latch (memory) 153-1 including a counter counting comparison time of the first comparator 152-1 and storing the count result of counter.

Each column processing circuit 151 has a second latch (memory) 153-2 including a counter counting comparison time of the second comparator 152-2 and storing the count result of counter.

Each column processing circuit 151 further includes a logic circuit 154 distinguishes and detects given states after A/D conversion based on a digital value stored in the first latch 153-1 and a digital value stored in the second latch 153-2 to calculate a digital definite value.

The logic circuit 154 distinguishes and detects the following states (given states) after the A/D conversion in a half period of time without changing 1 LSB. That is, the logic circuit 154 distinguishes and detects (1) a case where only the comparison result with respect to the second reference voltage Vslop 2 (ramp wave RAMP2) by the second comparator 152-2 has been inverted (2) a case where both the comparison result with respect to the first reference voltage Vslop 1 (ramp wave RAMP1) by the first comparator 152-1 and the comparison result with respect to the second reference voltage Vslop 2 (ramp wave RAMP2) by the second comparator 152-2 have been inverted.

FIG. 7 is a chart for explaining the function of the logic circuit according to the embodiment.

Figure 8A:
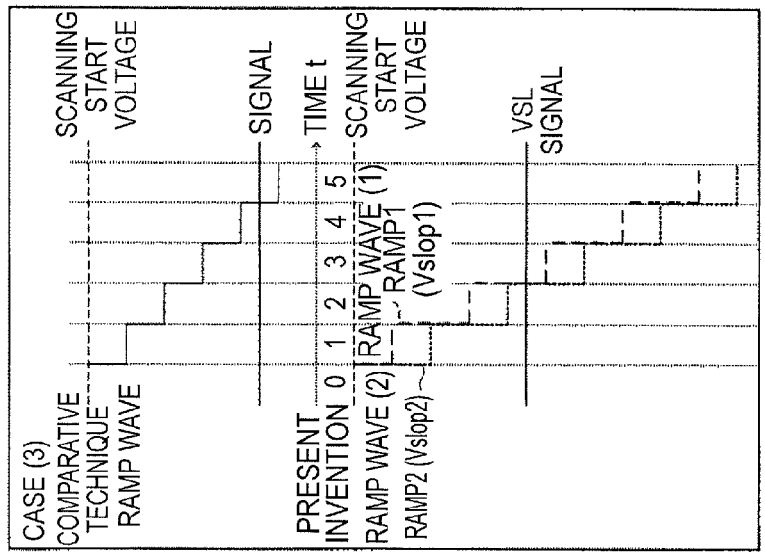
FIG. 8A to FIG. 8C are views schematically showing a first case (1), a second case (2) and a third case (3) of FIG. 7.
Figure 8B:
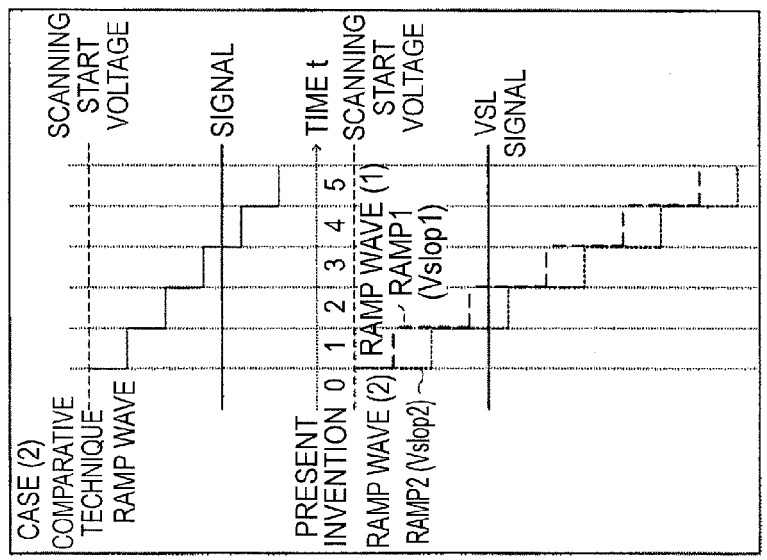
Figure 8C:
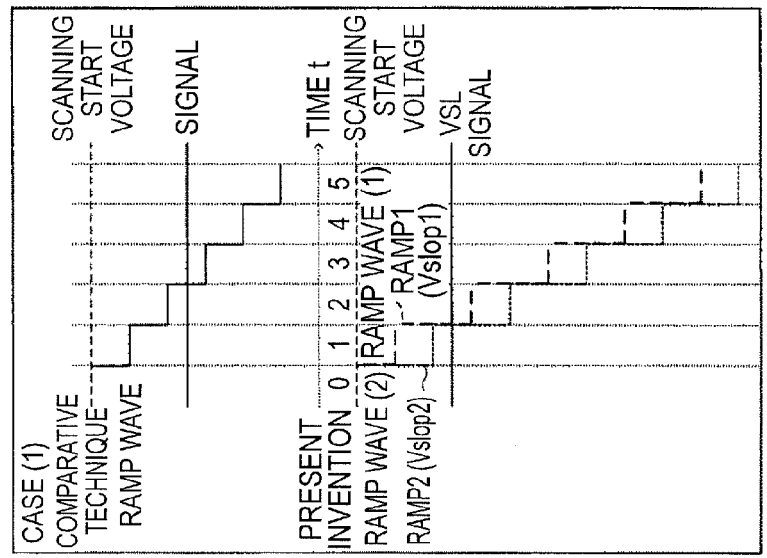

FIG. 8A to FIG. 8C are views schematically showing a first case (1), a second case (2) and a third case (3) of FIG. 7.

In this case, the normal technique using one reference voltage is shown as a comparative technique and a case where two reference voltages are used as in the embodiment is shown as a technique of the present invention.

The first case (1), the second case (2) and the third case (3) are three cases where the time "t" proceeds one by one, in which the step changes continuously.

The logic circuit 154 can output the same values of the memory as the comparative technique by using the following functions.

[1] A definite value VD1 of the first latch (memory) 153-1 and a definite value VD2 of the second latch (memory) 153-2 are summed.

[2] "1" is subtracted from the result of the sum.

An output VO is represented by the following formula.

$$VO = VD1 + VD2 - 1$$

In the first case, the definite value VD1 of the first memory 153-1 is "2", and the definite value VD2 of the second memory 153-2 is "2".

Accordingly, VO=2+2−1=3 based on the above (1).

The value is "3", which is the same value as the comparative technique.

In the second case, the definite value VD1 of the first memory 153-1 is "3" and a definite value VD2 of the second memory 153-2 is "2".

Accordingly, VO=3+2−1=4 based on the above (1).

The value is "4", which is the same value as the comparative technique.

In the third case, the definite value VD1 of the first memory 153-1 is "3" and a definite value VD2 of the second memory 153-2 is "3".

Accordingly, VO=3+3−1=5 based on the above (1).

The value is "5", which is the same value as the comparative technique.

In the column processing circuit 151, the first comparator 152-1 inverts an output signal SCMP1 when levels of the analog potential VSL and the first reference voltage Vslop1 intersect.

The second comparator 152-2 inverts an output signal SCMP2 when levels of the analog potential VSL and the second reference voltage Vslop2 intersect.

The first latch (memory) 153-1 performs counting operation in synchronization with, for example, a clock CLK. The latch stops the counting operation when the level of the output SCMP1 of the first comparator 152-1 is inverted, storing the value at that time.

The second latch (memory) 153-2 performs counting operation in synchronization with, for example, the clock CLK. The latch stops the counting operation when the level of the output SCMP2 of the second comparator 152-2 is inverted, storing the value at that time.

Then, calculation processing using definite values of the first and second latches (memories) 153-1, 153-2 is performed in the logic circuit 154 to be outputted.

Outputs of respective logic circuit 154 are connected to, for example, horizontal transfer lines LTRF having the k-bit width.

Then, k-pieces of amplifier circuits 170 corresponding to the horizontal transfer lines LTRF and the signal processing circuit 180 are arranged.

As described above, the column ADC in the embodiment has the function of using plural reference voltages so as to be offset by an arbitrary voltage at the same time point in a process of converting the analog signal VSL into a digital signal and calculating plural comparison results between the analog value and plural ramp waves.

Accordingly, it is possible to perform A/D conversion at higher speed than the normal configuration in the column ADC in the embodiment.

Since the execution time for the A/D conversion is reduced, the reduction of power consumption can be expected.

Additionally, the A/D conversion with high bit precision can be realized without increasing the reading time.

After the above A/D conversion period is completed, by the horizontal transfer circuit 130, data obtained by calculation in the logic circuits 154 is transferred to the horizontal transfer lines LTRF, inputted to the signal processing circuit 180 through the amplifier circuits 170 to thereby generate a two-dimensional image by a given signal processing.

In the horizontal transfer circuit 130, simultaneous parallel transfer of several channels is performed for securing transfer speed.

The timing control circuit 140 generates timings necessary for signal processing in respective blocks such as the pixel section 110 and the column processing circuit group 150.

The signal processing circuit 180 in the later step performs correction of vertical line defects or dot defects by signals stored in the line memories 190, clamp processing of signals and digital signal processing such as parallel-serial conversion, compression, encoding, addition, averaging and intermittent operation.

In the line memories 190, digital signals to be transmitted to respective pixel rows are stored.

In the solid-state imaging device 100 according to the embodiment, digital output of the signal processing circuit 180 is transmitted as the input of an ISP and a baseband LSI.

As a method used for reading pixel signals of the CMOS image sensor, there is a method in which signal charges to be a light signal generated in the photoelectric conversion element such as the photodiode are temporarily sampled in a capacitor in the later step through a MOS switch arranged in the vicinity of the photodiode and are read.

In a sampling circuit, noise having the inverse correlation is normally added to the sampling capacitor value.

In pixels, noise is not generated in the sampling process because the signal charges are completely transferred by using potential gradient when the signal charges are transferred to the sampling capacitor, however, noise is added when the voltage level of the capacitor in the previous step is reset to a certain reference value.

As a method of removing noise, the correlated double sampling (CDS) is applied.

This is the method in which the signal charges are read in a state before the sampling (reset level) and stored once, then, the signal level after the sampling is read and subtraction is performed between these levels to thereby remove noise.

3. Example of Forming Plural Reference Voltages by a DAC

Plural reference voltages (ramp waves) are generated by the DAC 161.

FIG. 6 is a view showing a first forming example of first and second reference voltages Vslop1, Vslop2.

In the example of FIG. 6, the first and second reference voltages Vslop1, Vslop2 are formed by shifting the two ramp waves (the ramp wave RAMP1 and the ramp wave RAMP2) in which one ramp wave has twice the width of the other ramp wave by the original step width thereof.

The example of FIG. 6 is one example, and the first and second reference voltages Vslop1, Vslop 2 can be formed, for example, as shown in FIG. 9 to FIG. 12.

Figure 9:
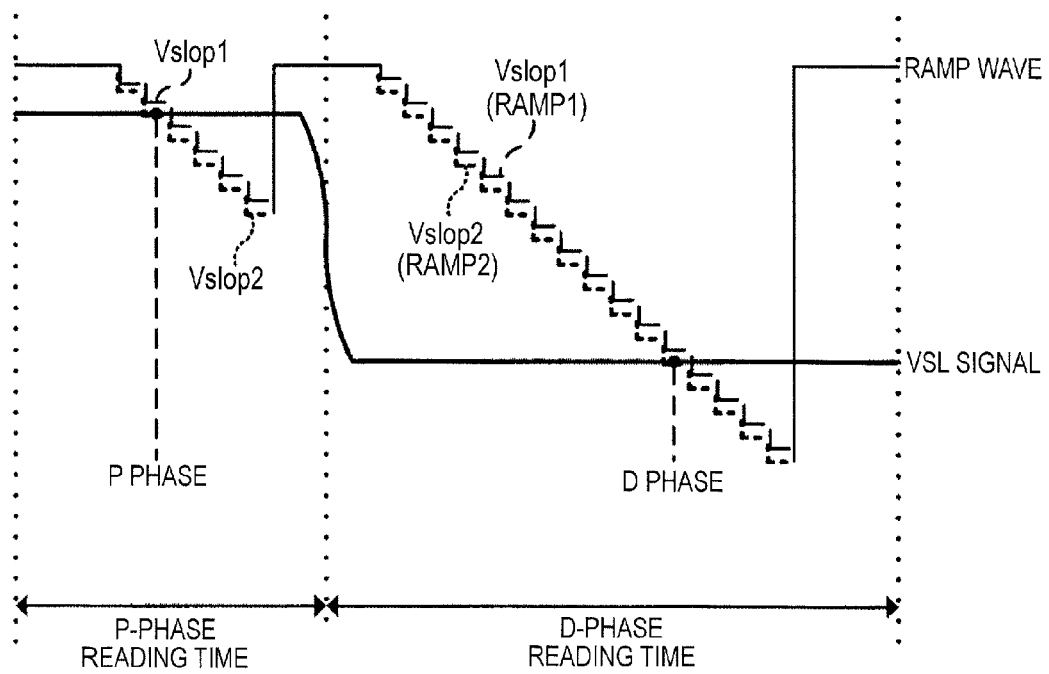
FIG. 9 is a view showing a second forming example of the first and second reference voltages according to the embodiment.

FIG. 9 is a view showing a second forming example of the first and second reference voltages Vslop1, Vslop2.

Figure 1:
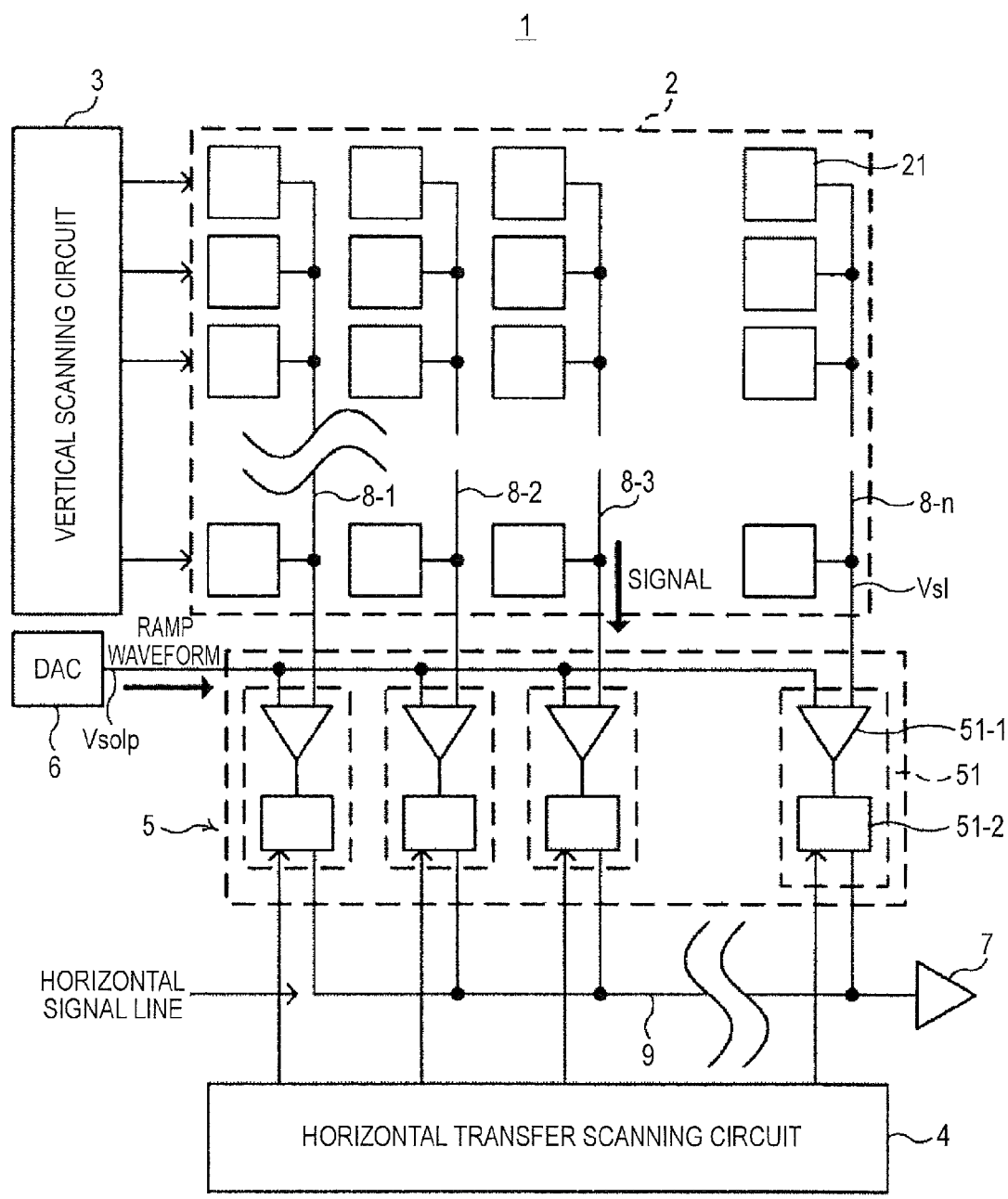
FIG. 1 is a block diagram showing a configuration example of a column-parallel ADC mounted solid-state imaging device (CMOS image sensor).
Figure 2:
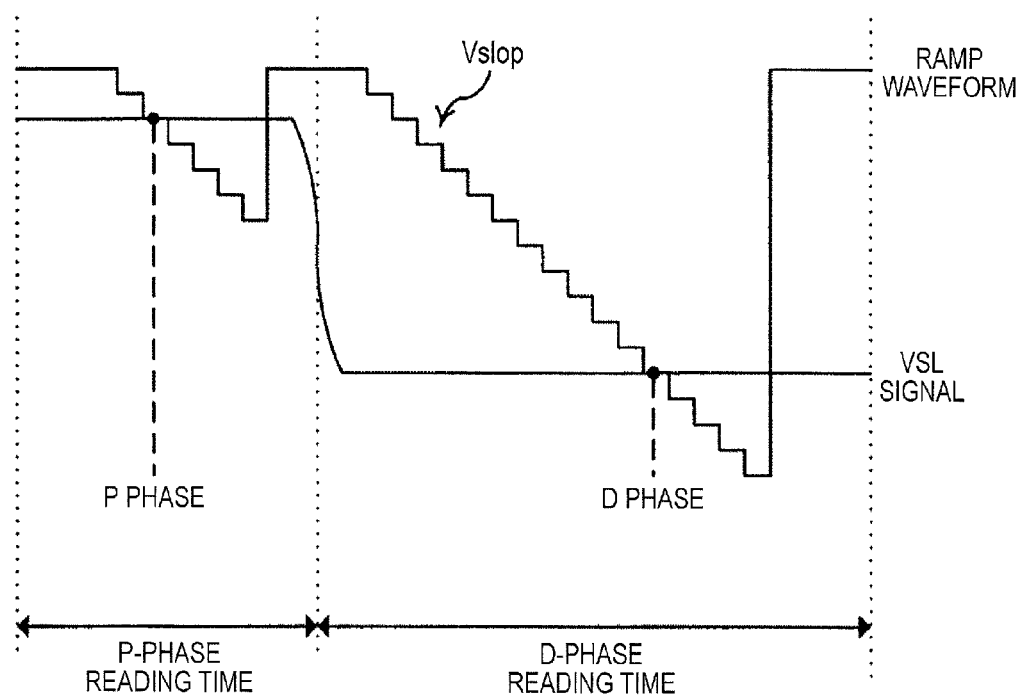
FIG. 2 is a timing chart of a circuit of FIG. 1.

In the example of FIG. 9, two first and second reference voltages Vslop1, Vslop2 (two ramp waves) having the same step width are used by shifting them by a half of the original step width, thereby reading the signal in the same period of time as in the case of FIG. 2 with double precision.

Figure 10:
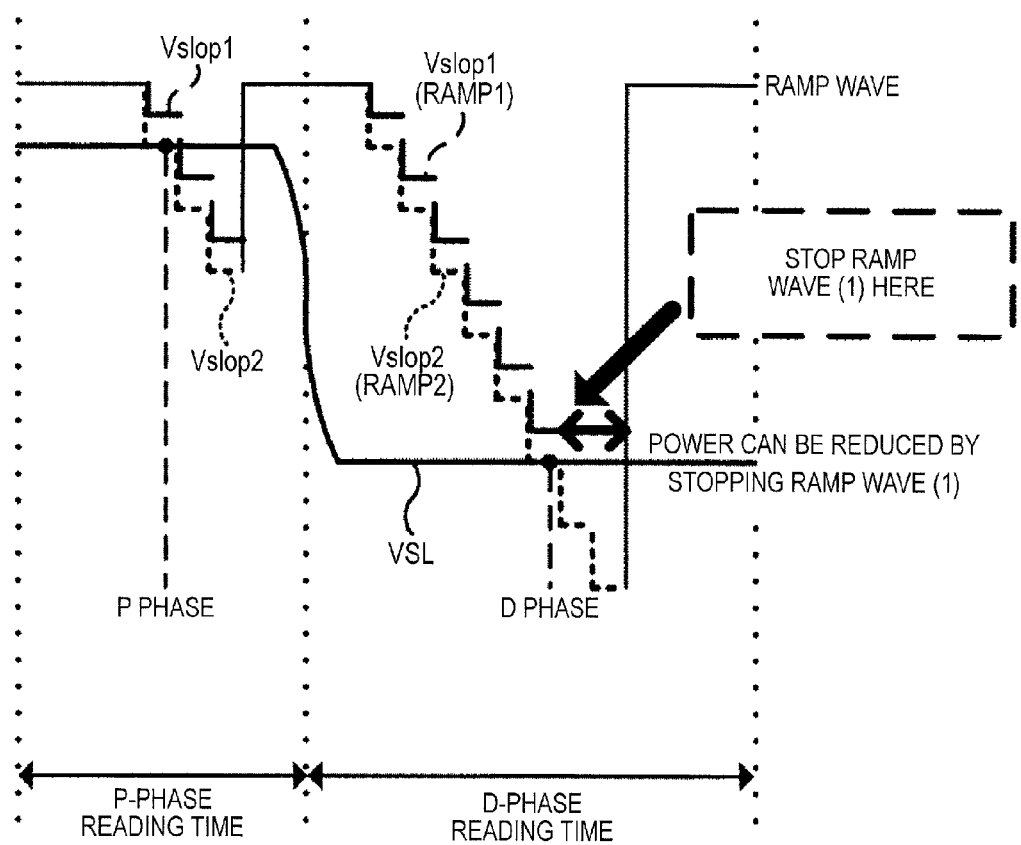
FIG. 10 is a view showing a third forming example of first and second reference voltages according to the embodiment.

FIG. 10 is a view showing a third forming example of first and second reference voltages Vslop1, Vslop2.

In the example of FIG. 10, the supply of one of the reference voltages (ramp waves) is stopped at the last half of the reading of the D phase, thereby reading the high-illumination side which is difficult to be viewed by human beings with low power consumption though with low precision.

Figure 11:
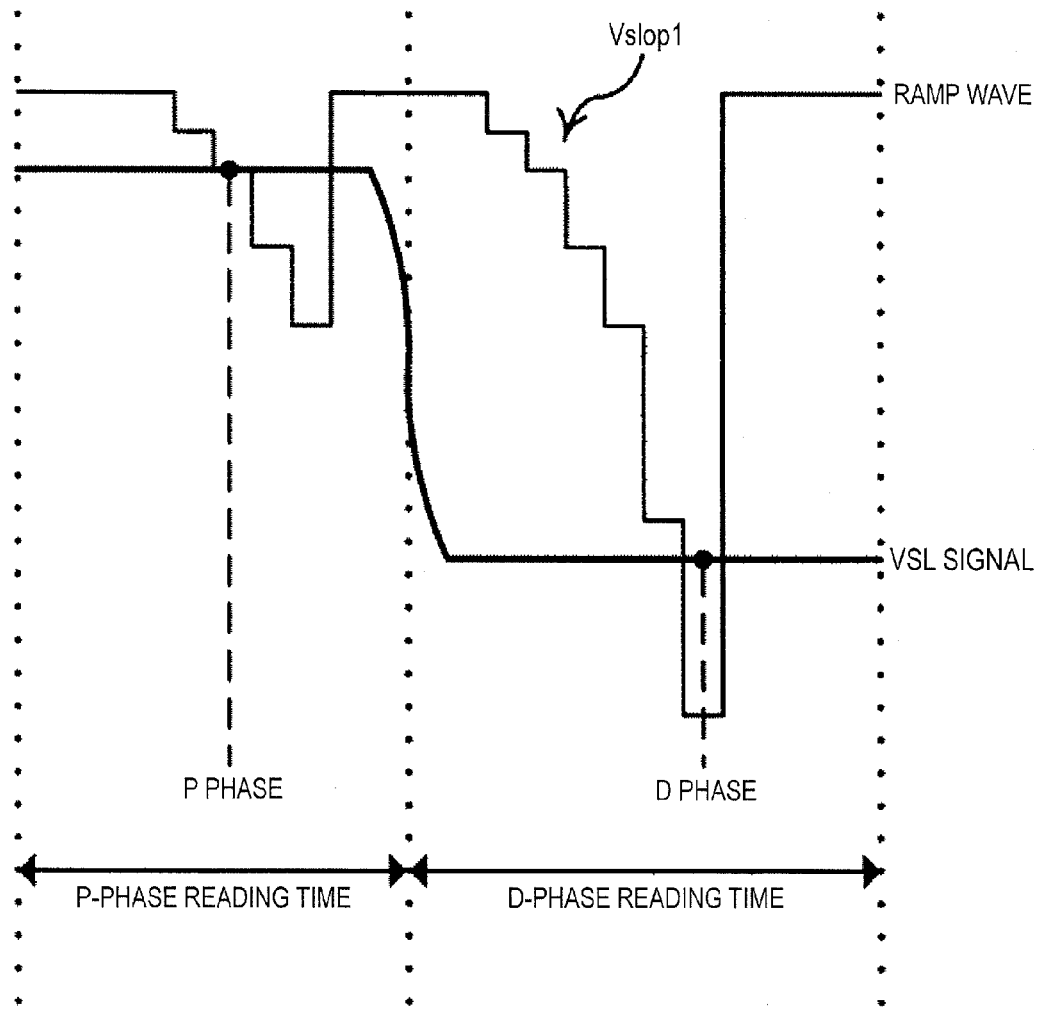
FIG. 11 is a view showing a fourth forming example of the first reference voltage.

FIG. 11 is a view showing a fourth forming example of the first reference voltage Vslop1 (refer to JP-A-2006-50231).

In the example of FIG. 11, the high illumination side can be low precision by using a single ramp wave the step width of which is variable.

Figure 12:
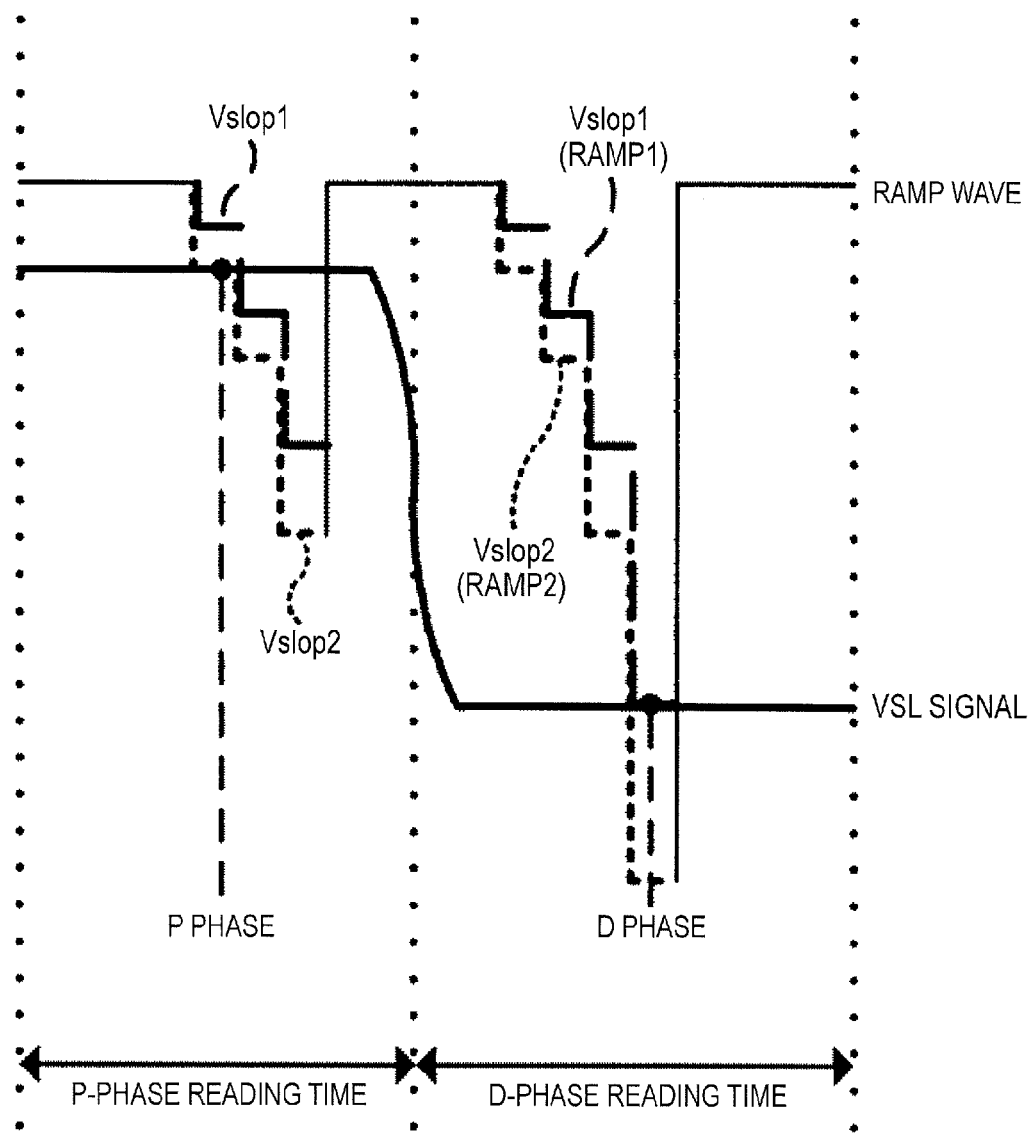
FIG. 12 is a view showing a fifth forming example of first and second reference voltages according to the embodiment.

FIG. 12 is a view showing a fifth forming example of first and second reference voltages Vslop1, Vlop2.

In the example of FIG. 11, the high illumination side can be low precision by using a single ramp wave the step width of which is variable, however, a reference voltage (ramp wave) with an arbitrary amount of offset is combined to thereby increase the precision by applying the invention.

As described above, the above circuit configuration of the DAC can be easily realized though it is necessary to prepare plural DAC slopes.

Next, operations by the above configuration will be explained.

In the DAC 161, the first reference voltage Vslop1 and the second reference voltage Vslop2 are generated during the P phase.

In each column processing circuit (ADC) 151, the analog signal potential VSL read to the vertical signal line 116 is compared with the first and second reference voltages Vslop1, Vslop2 in the first and second comparators 152-1, 152-2 arranged at each column.

Counting is performed in the first and the second latches (memories) 153-1, 153-2 until levels of the analog potential VSL and the first or second reference voltage Vslop1, Vslop2 intersect and outputs of the first and second comparators 152-1, 152-2 are inverted.

In the first latch (memory) 153-1, the counting operation is performed, for example, in synchronization with the clock CLK. The counting operation is stopped when the level of the output SCMP1 of the first comparator 152-1 is inverted, and the value at that time is stored.

In the second latch (memory) 153-2, the counting operation is performed, for example, in synchronization with the clock CLK. The counting operation is stopped when the level of the output SCMP2 of the second comparator 152-2 is inverted, and the value at that time is stored.

Then, the calculation processing using the definite values of the first and the second latches (memories) 153-1, 153-2 is performed in the logic circuit 154 to be outputted.

The reset level P phase includes variations according to pixels.

In the second time, signals photoelectrically converted in respective unit pixels 110A are read to the vertical signal lines 116 (116-1 to 116-*n*) (D phase), and the A/D conversion is performed.

In the DAC 161, both the first and second reference voltages Vslop1, Vslop2 which are ramp waves are generated also during the D phase.

In each column processing circuit (ADC) 151, the analog signal potential VSL read to the vertical signal line 116 is compared with the first and second reference voltages Vslop1, Vslop2 in the first and second comparators 152-1, 152-2 arranged at each column.

Counting is performed in the first and the second latches (memories) 153-1, 153-2 until levels of the analog potential VSL and the first or second reference voltage Vslop1, Vslop2 intersect and outputs of the first and second comparators 152-1, 152-2 are inverted.

In the first latch (memory) 153-1, the counting operation is performed, for example, in synchronization with the clock CLK. The counting operation is stopped when the level of the output SCMP1 of the first comparator 152-1 is inverted, and the value at that time is stored.

In the second latch (memory) 153-2, the counting operation is performed, for example, in synchronization with the clock CLK. The counting operation is stopped when the level of the output SCMP2 of the second comparator 152-2 is inverted, and the value at that time is stored.

Then, the calculation processing using the definite values of the first and the second latches (memories) 153-1, 153-2 is performed in the logic circuit 154 to be outputted.

(D phase level-P phase level) is executed with the results of conversions in the P-phase and the D phase, thereby realizing the correlated double sampling (CDS).

Signals converted into digital signals are sequentially read to the amplifier circuits 170 through the horizontal transfer lines LTRF by the horizontal (column) transfer scanning circuit 130 and finally outputted.

Accordingly, the column parallel output processing is performed.

As described above, the solid-state imaging device according to the embodiment includes the pixel section 110 in which plural pixels performing photoelectric conversion are arranged in a matrix state, the pixel signal reading circuit (column processing circuit group, ADC group) 150 performing reading of data row by row from the pixel section 110.

The solid-state imaging device 100 has the function of using plural reference voltages (ramp waves) so as to be offset by an arbitrary voltage at the same time point in a process of converting the analog signal VSL into a digital signal and calculating plural comparison results between the analog value and plural ramp waves.

Specifically, each column processing circuit 151 includes the first and second comparators 152-1, 152-2 which compare one analog signal obtained from pixels through the vertical signal line 116 with two first and second reference voltages Vslop1, Vslop2.

Each column processing circuit 151 includes the first latch (memory) 153-1 including the counter which counts comparison time of the first comparator 152-1 and storing count results by the counter.

Each column processing circuit 151 includes the second latch (memory) 153-2 including the counter which counts comparison time of the second comparator 152-2 and storing count results by the counter.

Each column processing circuit 151 further includes the logic circuit 154 distinguishes and detects the given states after A/D conversion based on the digital value stored in the first latch 153-1 and the digital value stored in the second latch 153-2 to calculate a digital definite value.

Therefore, the following advantages can be obtained according to the embodiment.

According to the embodiment, the A/D conversion can be performed at higher speed as compared with the normal configuration.

That is, the execution time necessary for the A/D conversion is reduced, therefore, reduction of power consumption can be expected.

Additionally, the A/D conversion with high bit precision can be realized without increasing the reading time.

According to the embodiment, plural ramp waves the step width of which is increased are used by shifting them to thereby realize the high-speed reading.

Also, plural ramp waves the step width of which is not changed are used by shifting them to thereby realize the high precision reading.

Furthermore, the reading with the low precision and low power consumption can be realized by stopping part of ramp waves.

When the number of steps of two ramp waves is the same but the amplitude thereof is different, variation of the ramp wave having small amplitude in each voltage of one step is small, and it is necessary that the comparator detects the minute voltage difference, therefore, it is necessary to improve precision (sensitivity) by changing design and so on.

On the other hand, reference voltages which are two ramp waves in the present embodiment are formed to have the same number of steps and the same amplitude, therefore, it is not necessary to improve the precision of the comparator for detecting the voltage of one step.

Since the ramp waves having the same amplitude are used, there is no possibility that the crossing with respect to signal voltages from the vertical signal lines (column lines) does not occur.

The solid-state imaging device having the above advantages can be applied as an imaging device used for a digital camera and a video camera.

4. Configuration Example of a Camera System

Figure 13:
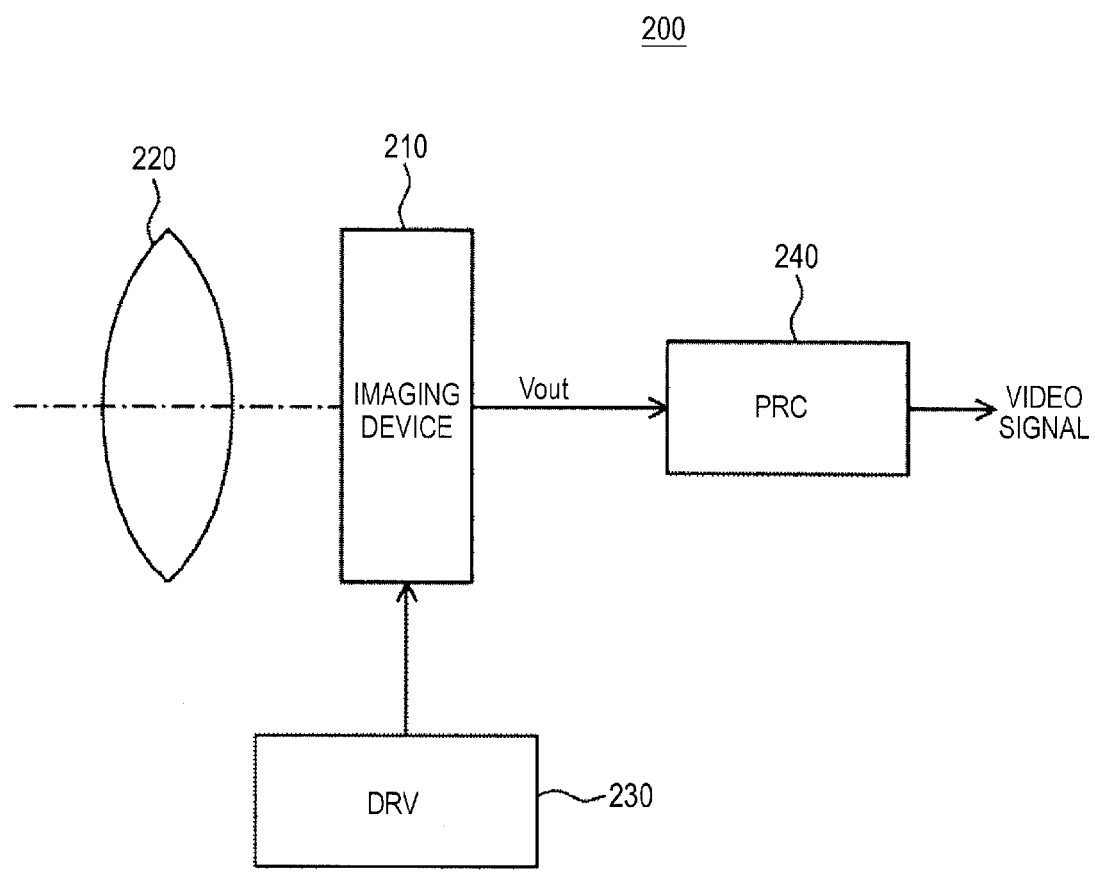
FIG. 13 is a view showing an example of a configuration of a camera system to which the solid-state imaging device according to an embodiment of the invention is applied.

FIG. 13 is a view showing an example of a configuration of a camera system to which the solid-state imaging device according to an embodiment of the invention is applied.

A camera system 200 includes an imaging device 210 to which the solid-state imaging device 100 according to the embodiment can be applied as shown in FIG. 13.

The camera system 200 includes, for example, a lens 220 which images incident light (image light) on an imaging surface as an optical system introducing incident light to a pixel area of the imaging device 210 (imaging a subject image).

The camera system 200 further includes drive circuit (DRV) 230 driving the imaging device 210 and a signal processing circuit (PRC) 240 processing output signals of the imaging device 210.

The drive circuit 230 has a timing generator (not shown) generating various timing signals including a start pulse and a clock pulse for driving circuits in the imaging device 210, which drives the imaging device 210 by a given timing signal.

The signal processing circuit 240 performs given signal processing with respect to output signals of the imaging device 210.

The image signals processed in the signal processing circuit 240 are recorded in a recording medium such as a memory. Image information recorded in the recording medium is hard copied by a printer and the like. The image signals processed in the signal processing circuit 240 are projected on a monitor including a liquid crystal display and the like as moving pictures.

As described above, in the imaging apparatus such as a digital still camera, the above described solid-state imaging device 100 is mounted as the imaging device 210, thereby realizing a high precision camera.

The present application contains subject matter related to that disclosed in Japanese Priority Patent Application JP 2009-100604 filed in the Japan Patent Office on Apr. 17, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An A/D converter comprising:
plural latches arranged so as to correspond to plural comparators for a single vertical line, respective ones of the plural latches being configured to count comparison time of a corresponding comparator, to stop counting when output of the corresponding comparator is inverted, and to store a count value,
wherein the plural comparators respectively receive reference voltages different from each other.

2. The A/D converter according to claim 1, further comprising
a logic circuit configured to distinguish and detect states based on respective digital values stored in the plural latches.

3. The A/D converter according to claim 2, wherein
the logic circuit is configured to distinguish and detect a first state where the outputs of only a portion of the plural comparators are inverted, and a second state where the outputs of all of the plural comparators are inverted.

4. The A/D converter according to claim 1, comprising
a first latch configured to count comparison time of a first comparator and store a count result; and
a second latch configured to count comparison time of a second comparator and store the count result.

5. The A/D converter according to claim 1, wherein the plural comparators respectively receive reference voltages having a ramp waveform.

6. A solid-state imaging device comprising:
a pixel section in which plural pixels configured to perform photoelectric conversion are arranged in a matrix state; and
a pixel signal reading circuit configured to perform reading of pixel signals from plural pixels in the pixel section,
wherein the pixel signal reading circuit includes plural latches arranged so as to correspond to plural comparators for a single vertical signal line, respective ones of the plural latches being configured to count comparison time of a corresponding comparator, to stop counting when output of the corresponding comparator is inverted, and to store a count value, and
wherein the plural comparators respectively receive reference voltages different from each other.

7. The solid-state imaging device according to claim 6, wherein the pixel signal reading circuit further comprises
a logic circuit configured to distinguish and detect states based on respective digital values stored in the plural latches.

8. The solid-state imaging device according to claim 7, wherein the logic circuit is configured to distinguish and detect a first state where the outputs of only a portion of the plural comparators are inverted, and a second state where the outputs of all of the plural comparators are inverted.

9. The solid-state imaging device according to claim 6, wherein the pixel signal reading circuit comprises:
a first latch configured to count comparison time of a first comparator and store a count result; and
a second latch configured to count comparison time of a second comparator and store the count result.

10. The solid-state imaging device according to claim 6, wherein the reading of pixel signals is performed twice in each row.

11. The solid-state imaging device according to claim 6, wherein the plural comparators respectively receive reference voltages having a ramp waveform.

12. A camera system comprising:
a solid-state imaging device; and
an optical system configured to image a subject image on the solid-state imaging device,
wherein the solid-state imaging device includes:
a pixel section in which plural pixels configured to perform photoelectric conversion are arranged in a matrix state; and
a pixel signal reading circuit configured to perform reading of pixel signals from plural pixels in the pixel section,
wherein the pixel signal reading circuit includes plural latches arranged so as to correspond to plural comparators for a single vertical signal line, respective ones of the plural latches being configured to count comparison time of a corresponding comparator, to stop counting when output of the corresponding comparator is inverted, and to store a count value, and
wherein the plural comparators respectively receive reference voltages different from each other.

13. The camera system according to claim 12, wherein the pixel signal reading circuit further comprises
a logic circuit configured to distinguish and detect states based on respective digital values stored in the plural latches.

14. The camera system according to claim 13, wherein the logic circuit is configured to distinguish and detect a first state where the outputs of only a portion of the plural comparators are inverted, and a second state where the outputs of all of the plural comparators are inverted.

15. The camera system according to claim 12, wherein the pixel signal reading circuit comprises:
a first latch configured to count comparison time of a first comparator and store a count result; and
a second latch configured to count comparison time of a second comparator and store the count result.

16. The camera system according to claim 12, wherein the reading of pixel signals is performed twice in each row.

17. The camera system according to claim 12, wherein the plural comparators respectively receive reference voltages having a ramp waveform.

* * * * *